US008482086B2

(12) United States Patent
Shimoyama et al.

(10) Patent No.: US 8,482,086 B2
(45) Date of Patent: Jul. 9, 2013

(54) THREE-DIMENSIONAL STRUCTURE AND ITS MANUFACTURING METHOD

(75) Inventors: Isao Shimoyama, Tokyo (JP); Kiyoshi Matsumoto, Tokyo (JP); Eiji Iwase, Cambridge, MA (US); Akihito Nakai, Tokyo (JP); Binh Khiem Nguyen, Tokyo (JP); Yusuke Tanaka, Tokyo (JP); Shuji Hachitani, Osaka (JP); Tohru Nakamura, Osaka (JP); Shoichi Kobayashi, Hyogo (JP)

(73) Assignees: The University of Tokyo, Tokyo (JP); Panasonic Corporation, Osaka (JP)

( * ) Notice: Subject to any disclaimer, the term of this patent is extended or adjusted under 35 U.S.C. 154(b) by 218 days.

(21) Appl. No.: 12/920,147

(22) PCT Filed: Mar. 13, 2009

(86) PCT No.: PCT/JP2009/001126
§ 371 (c)(1),
(2), (4) Date: Aug. 30, 2010

(87) PCT Pub. No.: WO2009/113315
PCT Pub. Date: Sep. 17, 2009

(65) Prior Publication Data
US 2011/0006383 A1  Jan. 13, 2011

(30) Foreign Application Priority Data

Mar. 13, 2008 (JP) ................................. 2008-064359

(51) Int. Cl.
*H01L 29/84* (2006.01)
(52) U.S. Cl.
USPC .... 257/414; 257/415; 257/417; 257/E29.324; 438/50; 438/51; 438/52; 73/862; 73/451

(58) Field of Classification Search
None
See application file for complete search history.

(56) References Cited

U.S. PATENT DOCUMENTS

| 5,101,669 A | 4/1992 | Holm-Kennedy et al. |
| 5,367,429 A | 11/1994 | Tsuchitani et al. |
| 2001/0020726 A1* | 9/2001 | Peterson et al. ............... 257/415 |

(Continued)

FOREIGN PATENT DOCUMENTS

| JP | 2-641 | 1/1990 |
| JP | 5-172846 | 7/1993 |

(Continued)

OTHER PUBLICATIONS

International Search Report issued Apr. 21, 2009 in International (PCT) Application No. PCT/JP2009/001126.

(Continued)

*Primary Examiner* — Fei Fei Yeung Lopez
(74) *Attorney, Agent, or Firm* — Wenderoth, Lind & Ponack, L.L.P.

(57) ABSTRACT

A plurality of three-dimensional structure configuring devices, each including an elastic body in which micro three-dimensional structure elements fixed to a substrate member are placed so as to be covered therewith and which is fixed to the substrate member, are placed within a film-like elastic body with the substrate members thereof spaced apart from one another so as to configure a three-dimensional structure. Thereby, the plurality of three-dimensional structure configuring devices can be placed with desired intervals of arrangement and in desired positions within the film-like elastic body and so that various specifications can be addressed.

7 Claims, 13 Drawing Sheets

U.S. PATENT DOCUMENTS

| | | | |
|---|---|---|---|
| 2002/0041025 A1* | 4/2002 | Tomihara | 257/730 |
| 2005/0172717 A1 | 8/2005 | Wu et al. | |
| 2005/0193823 A1 | 9/2005 | Amano | |
| 2006/0101912 A1 | 5/2006 | Wu et al. | |
| 2007/0188285 A1* | 8/2007 | Shimoyama et al. | 336/192 |
| 2007/0234793 A1 | 10/2007 | Liu et al. | |
| 2008/0043067 A1* | 2/2008 | Nayve et al. | 347/68 |
| 2009/0044639 A1 | 2/2009 | Maekawa | |

FOREIGN PATENT DOCUMENTS

| | | |
|---|---|---|
| JP | 2000-065653 | 3/2000 |
| JP | 2003-211398 | 7/2003 |
| JP | 2005-150220 | 6/2005 |
| JP | 2005-268758 | 9/2005 |
| JP | 2006-208248 | 8/2006 |
| JP | 2006-275979 | 10/2006 |
| JP | 2007-218906 | 8/2007 |
| JP | 2008-008854 | 1/2008 |
| JP | 2008-026178 | 2/2008 |
| JP | 2008-049438 | 3/2008 |

OTHER PUBLICATIONS

International Preliminary Report on Patentability and Written Opinion of the International Searching Authority (in English) issued Nov. 2, 2010 in International (PCT) Application No. PCT/JP2009/001126.

* cited by examiner

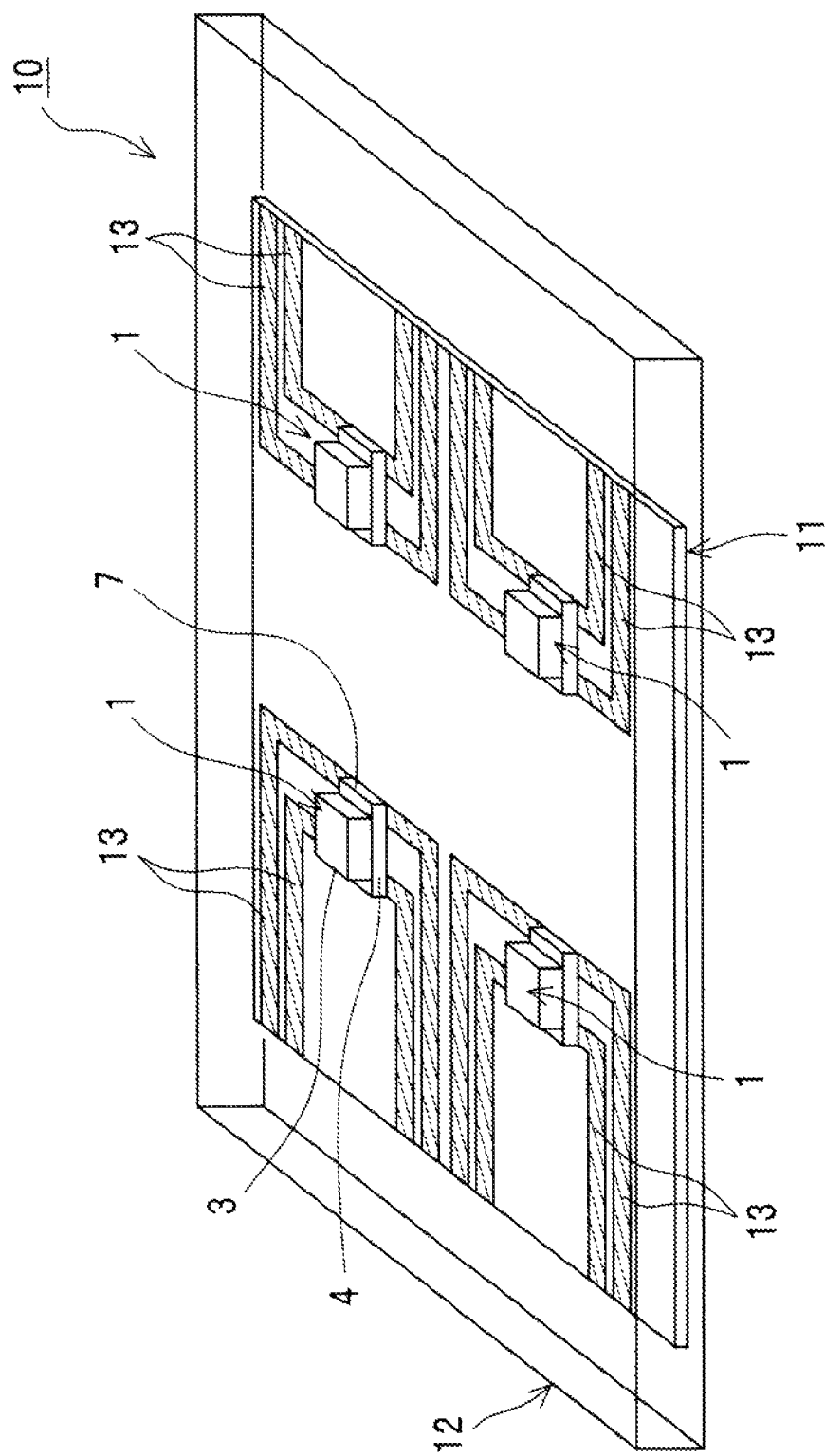

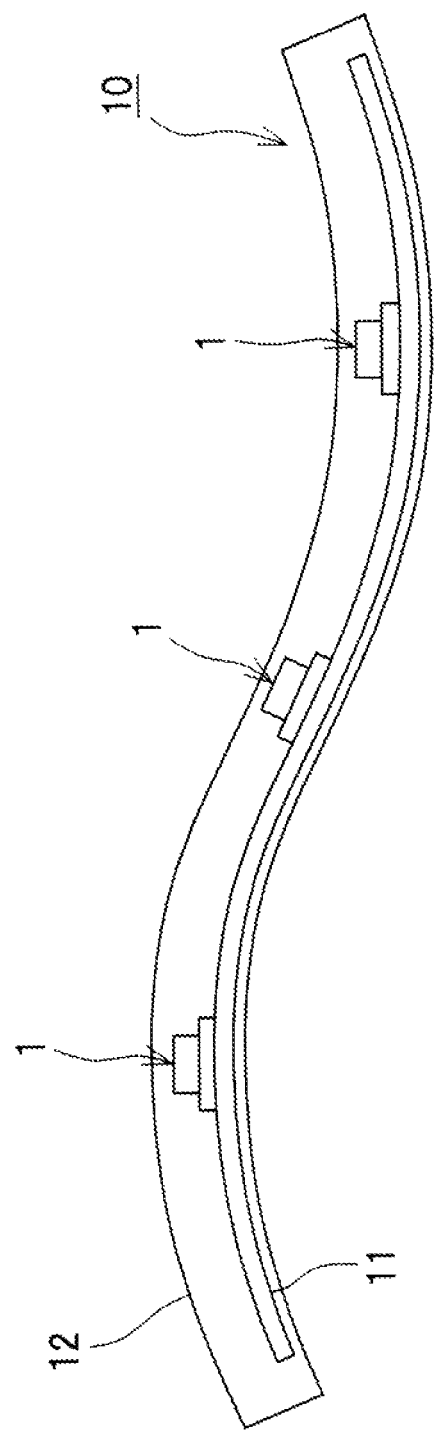

THREE-DIMENSIONAL STRUCTURE AND ITS MANUFACTURING METHOD

TECHNICAL FIELD

The present invention relates to a structure formed three-dimensionally by using MEMS (Micro Electro Mechanical Systems) technology or NEMS (Nano Electro Mechanical Systems) technology and its manufacturing method. In particular, the present invention relates to a device in which micro three-dimensional structure elements each having a movable structure are arranged in an elastic body, a three-dimensional structure configured with use of the device, and those manufacturing method.

BACKGROUND ART

In research and development of robot technology, it is one of important issues how an object is reliably controlled by a robot hand. With respect to an operation of grasping an object by a robot hand, specifically, not only detecting a grasping force to grasp the object but also detecting a shearing stress occurring to the hand surface due to the grasping operation is needed for reliable control of the robot hand. The reason of this is that detecting a frictional force caused between the object and the hand surface by the shearing stress contributes to exerting optimum frictional force control to fulfill reliable control of the object.

In recent years, tactile sensors aimed at detecting such a shearing stress have been being developed (see Patent Literature 1, for instance). An example of such conventional tactile sensors will be described below with reference to a schematic perspective view shown in FIG. 8.

As shown in FIG. 8, a tactile sensor 501 has a configuration in which a plurality of piezoresistive cantilevers 502 (cantilevers having piezoresistors on hinges thereof) formed from a thin film of about several hundred nanometers are placed in a film-like elastic body 503 so as to be independent of one another.

The cantilever 502 has one end formed as a fixed portion and the other end formed as a movable portion that can be deformed only in a thicknesswise direction of the thin film forming the cantilever 502. The cantilevers 502 are each electrically connected to a control unit, not shown, through terminal parts and interconnections that are not shown. When a shearing force or a pressure is exerted on a surface of the film-like elastic body 503, for instance, a shearing stress or a compressive stress produced inside the film-like elastic body 503 causes the movable portions of the cantilevers 502 to be moved and deformed, thus making it possible to detect the shearing force or the pressure. In order to detect shearing stresses or compressive stresses acting on the film-like elastic body 503 in various directions, the cantilevers 502 are arranged in the film-like elastic body 503 so that the movable portions thereof differ in direction of deformation, for example, so that the directions of the deformation are set along X-axis, Y-axis and Z-axis directions as shown in the drawing.

When the film-like elastic body 503 is brought into contact with an object or the like, the tactile sensor 501 configured in this manner is capable of detecting shearing stresses or compressive stresses that are produced in various directions in the film-like elastic body 503, by the cantilevers 502. Such a film-like elastic body 503 is formed of PDMS (polydimethylsiloxane), for instance, as material that is easily elastically deformed by application of an external force.

Hereinbelow will be described a method of manufacturing the tactile sensor 501 having such a configuration.

As shown in a schematic illustration of FIG. 9, an SOI wafer 510 having, e.g., two cantilevers 502 formed thereon is placed in a container 517 with the wafer supported by a spacer 516 formed of PDMS. After that, fluidized elastic body PDMS 519 is injected into the container 517, as shown in FIG. 9. The injection of the PDMS 519 is performed in such a manner that at least the cantilevers 502 and fixed parts of the cantilevers 502 on the SOI wafer 510 are immersed and embedded in the injected PDMS 519.

After the PDMS 519 injected into the container 517 is subsequently cured, parylene layers 518, as strength-reinforcing members, deposited on a surface of the SOI wafer 510 exposed from the PDMS 519 are partially removed by $O_2$ plasma etching process, for instance.

Subsequently, an etching process is performed from a top face of the container 517, so that Si layers 511 and $SiO_2$ layer 512 are removed which are exposed from the PDMS 519 and which are sacrifice layers of the SOI wafer 510. As a result, as shown in FIG. 10, the fixed parts of the cantilevers 502 on the SOI wafer 510 are removed, so that recesses 520 are formed on the surface of the PDMS 519. By the removal of the sacrifice layers that have fixed the cantilevers 502, accordingly, the individual cantilevers 502 are arranged independently of one another in the PDMS 519.

After that, as shown in FIG. 11, fluidized PDMS 519 is injected into the recesses 520 formed on the surface of the PDMS 519, so that PDMS 519 is resupplied. After this resupply, the injected PDMS 519 is cured, and the film-like elastic body 503 formed of the PDMS is formed, so that the tactile sensor 501 is finished.

Patent Literature 1: JP 2007-218906 A

SUMMARY OF INVENTION

Problems to be Solved by the Invention

In the tactile sensor 501 having such a structure, which employs the manufacturing method including the placement in the PDMS 519 of the cantilevers 502 formed on the SOI wafer 510 and the subsequent removal of the sacrifice layers that are the fixed parts on the SOI wafer 510, positions where the cantilevers 502 are formed on the SOI wafer 510 become positions where the cantilevers 502 are formed in the tactile sensor 501, just the way they are. This causes a problem in that it is difficult to form the tactile sensor 501 using the film-like elastic body 503 in shape of a large-area sheet, for instance. The limitation of the positions where the cantilevers 502 are formed on the SOI wafer 510 makes it difficult to place the cantilevers 502 with desired pitches in the film-like elastic body 503. That is, there is a problem in that restraints on size of the tactile sensor 501, intervals of arrangement of the cantilevers 502 and the like make it impossible to manufacture the tactile sensors 501 with specifications corresponding to applications thereof.

If the SOI wafer 10 having a large number of the cantilevers 502 formed thereon is cut into pieces of the individual cantilevers 502, for example, it is conceivable that handling thereof may become difficult to carry out by a danger of causing damages or the like to the cantilevers 502 which are minute structures.

Therefore, an object of the invention is to resolve the problems and to provide a three-dimensional structure in which micro three-dimensional structure elements each having a movable structure formed by using the MEMS technology or NEMS technology are placed within a film-like elastic body, a three-dimensional structure configuring device and the three-dimensional structure being capable of coping with various specifications and improving handling ability in manufacture thereof by placement of the micro three-dimensional structure elements in desired positions, and its manufacturing method.

Means to Solving the Problem

In order to achieve the object, the invention is configured as follows.

According to a first aspect of the present invention, there is provided a three-dimensional structure configuring device comprising:

a micro three-dimensional structure element having a movable structure;

a substrate member to which the micro three-dimensional structure element is fixed; and an elastic body within which the micro three-dimensional structure element is placed, wherein the substrate member includes engagement portion in shape of depression or protrusion, the elastic body is fixed to the substrate member with the elastic body being engaged with the engagement portion.

According to a second aspect of the present invention, there is provided the three-dimensional structure configuring device as defined in the first aspect, wherein a plurality of engagement holes are formed as the engagement portion around position on the substrate member to which the micro three-dimensional structure elements is fixed, and the plurality of engagement holes are filled with the elastic body.

According to a third aspect of the present invention, there is provided the three-dimensional structure configuring device as defined in the first or second aspect, wherein the movable structures are structures deformable substantially in one direction, and a plurality of the micro three-dimensional structure elements differing from one another in deformable direction are placed within the one elastic body with the micro three-dimensional structure elements being fixed to the one substrate member.

According to a fourth aspect of the present invention, there is provided the three-dimensional structure configuring device as defined in the third aspect, wherein the substrate member comprises a common circuit unit for, transmitting electrical signals between the unit and the micro three-dimensional structure elements.

According to a fifth aspect of the present invention, there is provided a three-dimensional structure comprising:

a plurality of the three-dimensional structure configuring devices as defined in any one of the first through fourth aspects, and a film-like elastic body within which the plurality of three-dimensional structure configuring devices are placed so that the substrate members are spaced apart from each other.

According to a sixth aspect of the present invention, there is provided the three-dimensional structure as defined in the fifth aspect, wherein resin forming the elastic bodies has higher flowability in molten state than resin forming the film-like elastic body.

According to a seventh aspect of the present invention, there is provided the three-dimensional structure as defined in the fifth or sixth aspect, further comprising a flexible substrate on which the plurality of three-dimensional structure configuring devices are mounted, wherein the flexible substrate is placed within the film-like elastic body.

According to an eighth aspect of the present invention, there is provided a manufacturing method for three-dimensional structure configuring devices, the method comprising:

placing a plurality of micro three-dimensional structure elements within an elastic body, and fixing the elastic body to a substrate member while engaging the elastic body with engagement portions formed on the substrate member and shaped like depressions or protrusions, thereafter cutting the substrate member and the elastic body so as to divide the plurality of micro three-dimensional structure elements into groups, and thereby forming the plurality of three-dimensional structure configuring devices in each of which one or more micro three-dimensional structure elements are fixed to one of the divided substrate members and are placed within one of the divided elastic bodies.

According to a ninth aspect of the present invention, there is provided the manufacturing method for three-dimensional structure configuring device as defined in the eighth aspect, the method further comprising:

forming a plurality of engagement holes as the engagement portions around positions on the substrate member to which the micro three-dimensional structure elements are fixed, thereafter supplying resin material in fluidized state onto the substrate member so that the micro three-dimensional structure elements are covered with the resin material and so that the plurality of engagement holes are filled with the resin material, and thereafter curing the resin material to fix to the substrate member the elastic body formed of the resin material.

According to a tenth aspect of the present invention, there is provided a manufacturing method for a three-dimensional structure, the method comprising forming the three-dimensional structure by placing the plurality of three-dimensional structure configuring devices, manufactured by the manufacturing method of the eighth or ninth aspect, within a film-like elastic body so that the substrate members thereof are spaced apart from each another.

According to an eleventh aspect of the present invention, there is provided the manufacturing method for a three-dimensional structure of the tenth aspect, wherein resin forming the elastic bodies has higher flowability in molten state than resin forming the film-like elastic body.

Effect of the Invention

According to the invention, the plurality of three-dimensional structure configuring devices, each including the elastic body in which the micro three-dimensional structure elements fixed to the substrate member are placed so as to be covered therewith and which is fixed to the substrate member, are placed within the film-like elastic body with the substrate members thereof spaced apart from one another so as to configure the three-dimensional structure. Thus the plurality of three-dimensional structure configuring devices can be placed with desired intervals of arrangement and in desired positions within the film-like elastic body and the three-dimensional structure capable of addressing various specifications can be provided.

According to the method of manufacturing three-dimensional structure configuring devices of the invention, the plurality of micro three-dimensional structure elements formed on the substrate member are covered with the elastic body, the substrate member and the elastic body are thereafter cut so that the division into one or more micro three-dimensional structure elements and the formation of the plurality of three-dimensional structure configuring devices can be attained. In the cutting process, the micro three-dimensional structure elements covered with and protected by the elastic body are prevented from being damaged and thus satisfactory handling ability for the three-dimensional structure configuring devices formed by the division can be ensured.

The fixation of the elastic body to the substrate member is achieved by the engagement between the engagement portions provided on the substrate member and the elastic body so that the strength of the fixation can be increased. In the three-dimensional structure configuring device, accordingly, the integrity between the movable structures of the micro three-dimensional structure elements and the elastic body can be increased and thus the correlation between the movement of the movable structures and the deformation of the elastic body can be strengthened.

BRIEF DESCRIPTION OF DRAWINGS

These aspects and features of the present invention will become clear from the following description taken in conjunction with the preferred embodiments thereof with reference to the accompanying drawings, in which:

FIG. 3 is a schematic perspective view of a tactile sensor configured with use of the sensor devices;

FIG. 4 is a schematic section of the tactile sensor of FIG. 3;

DETAILED DESCRIPTION OF THE INVENTION

Hereinbelow, an embodiment of the invention will be described in detail with reference to the drawings.

Figure 1:
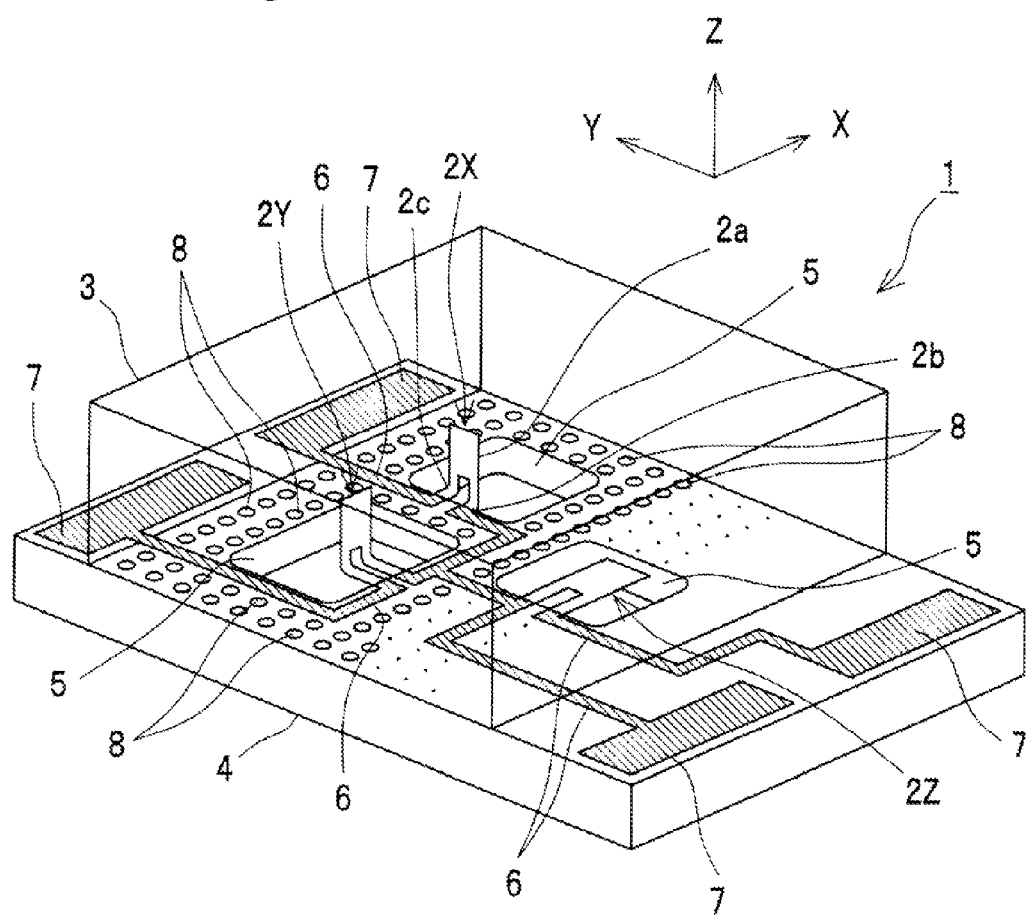
FIG. 1 is a schematic perspective view of a sensor device in accordance with an embodiment of the invention.

FIG. 1 shows a schematic perspective view illustrating a schematic structure of a sensor device 1 that is an example of a three-dimensional structure configuring device used for configuring a tactile sensor (or a tactile sensor structure) that is an example of a three-dimensional structure according to one embodiment of the invention.

As shown in FIG. 1, the sensor device 1 of the embodiment has a plurality of cantilevers 2 that are an example of micro three-dimensional structure elements each having a movable structure, a substrate member 4 to which the plurality of cantilevers 2 are fixed, and an elastic body 3 that is fixed onto the substrate member 4 so as to fully cover all the cantilevers 2.

Figure 2:
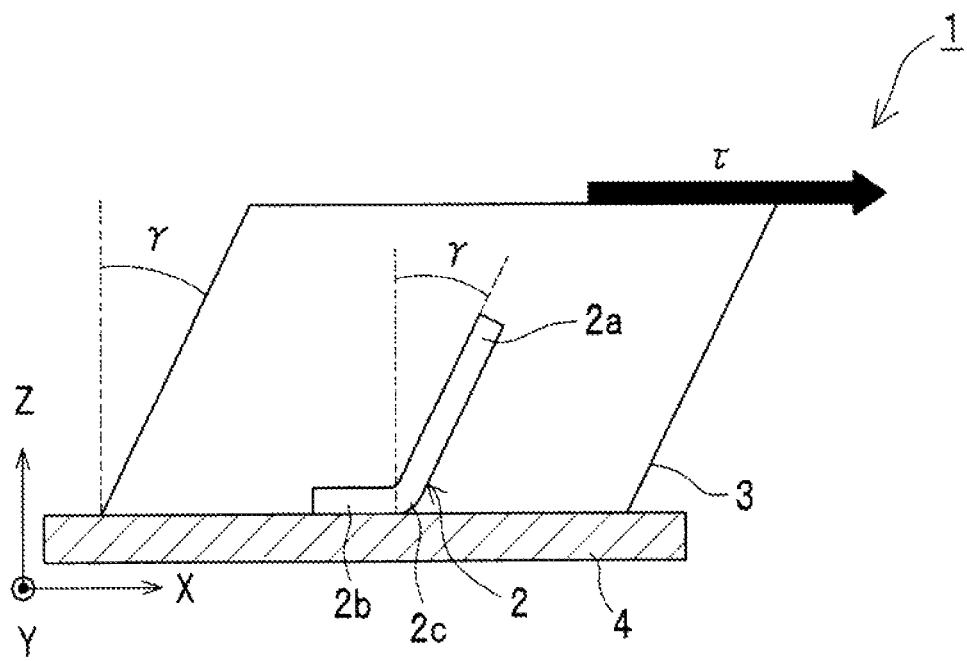
FIG. 2 is a schematic illustration for illustrating an external-force detecting function of the sensor device of FIG. 1.

As shown in FIG. 2 that is a schematic illustration of the sensor device 1, each of the cantilevers 2 is shaped like a thin film having a thickness, e.g., on the order of several hundred nanometers, and is formed as a movable structure, i.e., a cantilever structure with one end (fixed end) thereof provided as a fixed portion 2b fixed to the substrate member 4 and with the other end (free end) thereof provided as a movable portion 2a. The cantilever 2 is formed so that a thickness thereof is sufficiently small with respect to a widthwise direction thereof, and thus the movable portion 2a can be deformed in a thicknesswise direction thereof with respect to the fixed portion 2b. Further, in each cantilever 2 is provided a hinge portion 2c as an example of a connecting portion that connects the movable portion 2a and the fixed portion 2b to each other so that deformation of the connecting portion moves the movable portion 2a, and in the hinge portion 2c is provided a piezoresistive portion for electrically detecting a moving angle of the movable portion 2a.

As shown in FIG. 1, the sensor device 1 includes three types of cantilevers 2 that differ in the deforming direction of the movable portion 2a from one another, for example, an X-axis direction cantilever 2X having a deforming direction along an X-axis direction shown in the drawing, a Y-axis direction cantilever 2Y having a deforming direction along a Y-axis direction in the drawing, and a Z-axis direction cantilever 2Z having a deforming direction along a Z-axis direction in the drawing. In FIG. 1, the X-axis direction and the Y-axis direction are directions that extend along a surface of the substrate member 4 and that are orthogonal to each other, and the Z-axis direction is a direction that is orthogonal to the X-axis and Y-axis directions.

The elastic body 3 is formed of elastic material that is elastically deformed by application of an external force or the like and that has such flexibility that the elastic deformation causes the movable portions 2a of the cantilevers 2 to be moved (deformed), and transparent or colored PDMS (polydimethylsiloxane) as an example is used as such elastic material. The elastic body 3 has a function of protecting the cantilevers 2 from being damaged by direct contact with external objects or the like, and is thus formed with such a thickness as to completely cover each cantilever 2, e.g., on the order of 300 μm to 1 mm or less, more preferably, with a thickness such that both flexibility and strength are ensured while a stress detecting function, which will be described later, of the cantilevers 2 is effectively achieved.

As shown in FIG. 1, a piercing aperture 5 for each cantilever 2 is formed in a position on the substrate member 4 where each cantilever 2 is formed, and the fixed portion 2b of the cantilever 2 is fixed to an edge of the piercing aperture 5. Each piercing aperture 5 is formed in a size such that the movable portion 2a of the cantilever 2 may not interfere with the edge of the piercing aperture 5.

Though not shown in FIG. 1, a terminal portion is provided in the fixed portion 2b of each cantilever 2, and the terminal portions are independently provided with interconnections 6 so that the moving angle of the movable portion 2a in each cantilever 2 can be detected electrically. In the sensor device 1 is provided a circuit unit (a control circuit and the like, not shown) for transmitting electrical signals between the unit and the cantilevers 2 through the interconnections 6.

On both end parts of the substrate member 4 with respect to the Y-axis direction shown in the drawing are provided electrode terminals 7 to which the respective interconnections 6 are connected. The elastic body 3 is placed on a top surface of the substrate member 4 so as to expose the electrode terminals 7 and so as to fully cover the entirety of the piercing apertures 5 and the cantilevers 2. Though the electrode terminals 7 are exposed on the top surface of the substrate member 4 in FIG. 1, the electrode terminals 7 may be exposed on a back surface of the substrate member 4. In this configuration, the electrode terminals 7 are electrically connected to the interconnections 6 via conductive material or the like piercing the substrate member 4.

As shown in FIG. 1, a large number of engagement holes 8 as an example of engagement portions are formed around the piercing apertures 5 on the top surface of the substrate member 4. The engagement holes 8 are filled with the elastic body 3, so that the elastic body 3 and the substrate member 4 are firmly engaged with and fixed to each other by engagement between the engagement holes 8 and the elastic body 3 filling inside thereof. In order to ensure that the engagement holes 8 may be filled with the elastic body 3, the material used for the elastic body 3 preferably has high flowability (in molten state before curing) such that the material may easily come into nanoscale structures (such as holes), for instance. As such material may be used a product such as Sylgard184, made by Dow Coning Corporation, for use in modeling, transcription and/or the like of nanoscale structures.

As for the sensor device 1 having such a configuration, a shearing stress or a compressive stress caused inside the elastic body 3 by application of an external force to the elastic body 3 can be detected by movement and deformation of the movable portion 2a of the cantilever 2 having the movable portion 2a of which the deforming direction coincides with a direction in which the stress is exerted. The X-axis direction cantilever 2X and the Y-axis direction cantilever 2Y in FIG. 1 function as shearing force sensors for detecting forces (shearing force) that occur in directions along the surface of the film-like elastic body 3, while the Z-axis direction cantilever 2Z functions as a pressure sensor for detecting a force, i.e., a compressive stress, in the Z-axis direction in the film-like elastic body 3. The Z-axis direction cantilever 2Z may be shaped like a cantilever in a manner similar to the cantilevers 2X and 2Y, as shown in FIG. 1, or may alternatively be shaped like a both-end supported beam having both ends fixed to the substrate member 4.

Hereinbelow, a principle of stress detection by such a cantilever 2 will be described with reference to the schematic illustration of the sensor device 1 shown in FIG. 2.

Upon application of an external force acting along the surface of the elastic body 3 in the sensor device 1, as shown in FIG. 2, a shearing stress τ occurs in a horizontal direction in the elastic body 3, causing elastic deformation of the elastic body 3, which causes a shearing strain γ in the horizontal direction. The movable portion 2a of a cantilever 2 placed in the elastic body 3 is distorted integrally with the elastic body 3 and is consequently deformed, i.e., elastically deformed, to an extent corresponding to the shearing strain γ in the deforming direction thereof (e.g., in the X-axis direction shown in the drawing).

In the hinge portion 2c of the cantilever 2 is provided the piezoresistive portion. The piezoresistive portion has a function by which an electrical resistance value thereof changes according to an amount of the deformation of the movable portion 2a, and a correlation between such amounts of the deformation and the resistance values has been measured in advance and inputted and stored as correlation data into the control unit or the like connected to the electrode terminals 7 and not shown. Accordingly, the shearing stress τ produced in the elastic body 3 by the action of the external force can be detected on basis of detection of a change in resistance of the piezoresistive portion that is based on an amount of deformation of the cantilever 2 resulting from the shearing strain γ caused in the elastic body 3 by the shearing stress τ. According to such a principle of stress detection by the detection of deformation amount of the movable portion 2a, raised angles of the movable portions in the X-axis direction cantilever 2X and the Y-axis direction cantilever 2Y for detecting forces in directions along the surface of the elastic body 3 are preferably set at 90 degrees, while a raised angle of the movable portion in the Z-axis direction cantilever 2Z for detecting a pressure is preferably set at 0 degree.

Hereinbelow, a structure of the tactile sensor 10 employing a plurality of sensor devices 1 having such a structure will be described with reference to a schematic diagram of FIG. 3.

As shown in FIG. 3, the tactile sensor 10 has a flexible substrate 11 on which the plurality of sensor devices 1 are mounted in specified positions and a film-like elastic body 12 that encloses the sensor devices 1 and the flexible substrate 11 so as to fully cover the sensor devices 1 and the flexible substrate 11. The flexible substrate 11 has high flexibility and has interconnections 13, formed therein, for transmission of signals from and to the mounted sensor devices. The interconnections 13 are connected to the electrode terminals 7, exposed on the top surfaces of the substrate members 4 of the sensor devices 1, through conductive wires or are directly connected to the electrode terminals 7 exposed on the back surfaces of the substrate members 4 of the sensor devices 1. The sensor devices 1 are mounted in the specified positions so as to be spaced apart from one another, e.g., with the substrate members 4 spaced apart from one another, in order that the sensor devices 1 may not come into contact with one another. The film-like elastic body 12 is formed of elastic material having high flexibility and, e.g., PDMS is used as such elastic material.

As shown in a schematic diagram of FIG. 4, the tactile sensor 10 of the embodiment with such a configuration has such high flexibility that the tactile sensor 10 can be placed on surfaces having various shapes, e.g., a curved surface and then can detect an external force (shearing force or pressure) applied to the film-like elastic body 12.

Subsequently, a method of manufacturing the sensor devices 1 having such functions will be described below with reference to drawings. For the description of the manufacturing method, FIGS. 5A to 5E show schematic sections illustrating procedures of the method of manufacturing the sensor devices 1 and FIGS. 6A to 6D show schematic perspective views illustrating status of the sensor devices 1 in respective steps.

Figure 5A:
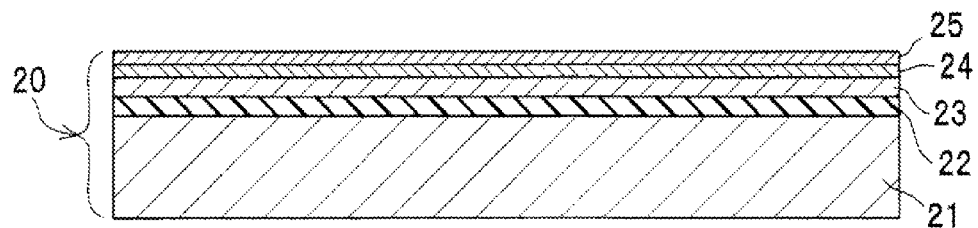
FIG. 5A is a schematic diagram of a method of manufacturing the sensor devices, showing status in which a substrate member has been formed.

At first, as shown in FIG. 5A, with use of, e.g., an SOI wafer 20 composed of a 300 μm thick Si lower layer 21, a 400 nm thick $SiO_2$ layer 22 and a 290 nm thick Si upper layer 23, an upper 100 nm portion of the Si upper layer 23 is formed as a piezoresistive layer (portion) 24 by using a rapid thermal diffusion method, for instance, and Au/Ni layers 25 with thicknesses of 10 nm and 150 nm are thereafter formed on the piezoresistive layer 24 by sputtering or the like. The SOI wafer 20 finally becomes the substrate member 4.

Figure 5B:
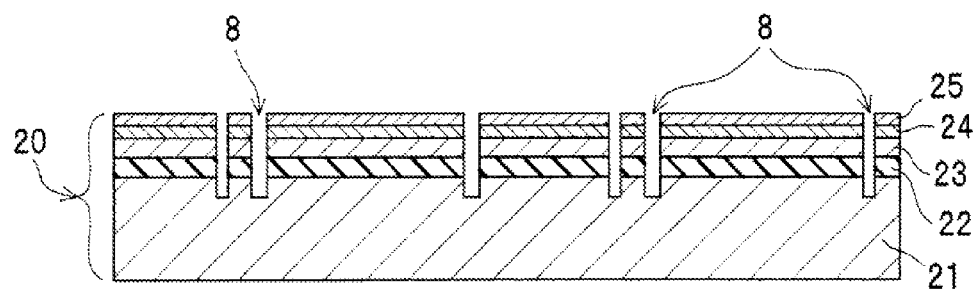
FIG. 5B is a schematic diagram of the method of manufacturing the sensor devices, showing status in which engagement holes have been formed on the substrate member.

On the SOI wafer 20, subsequently, the plurality of engagement holes 8 are formed, from a side of the Au/Ni layers 25, around the positions where the cantilevers 2 are to be formed. Specifically, a mask layer (not shown) patterned into a specified shape is formed on the Au/Ni layers 25, which are thereafter etched, and the piezoresistive layer 24 and the Si upper layer 23 are subsequently etched by DRIE (Deep Reactive Ion Etching). After that, the $SiO_2$ layer 22 is etched with use of HF (hydrogen fluoride) solution, and the Si lower layer 21 is etched by DRIE. By this etching process, as shown in FIG. 5B, the plurality of engagement holes 8 are formed on the SOI wafer 20. The engagement holes 8 are formed, preferably, around and in vicinity of the positions where the cantilevers 2 are to be formed later, and are formed with a depth on the order of 40 μm, for instance, in such positions as may not interfere with other components such as the interconnections 6. The mask layer is removed after the etching process is completed.

Then a mask layer (not shown) is formed on the Au/Ni layers 25 on which the plurality of engagement holes 8 are formed, is thereafter patterned into a specified shape, and etching on the Au/Ni layers 25, the piezoresistive layer 24 and the Si upper layer 23 is performed with use of the mask layer. In order to form the piezoresistive portions of the cantilevers 2, after that, the mask layer that is placed so as to cover regions corresponding to the hinge portions 2c linking the fixed portions 2b and the movable portions 2a of the cantilevers 2 is removed by etching. After that, the Si lower layer 21 is etched by DRIE from a back surface side of the SOI wafer 20, and the $SiO_2$ layer is etched with use of HE gas, so that a structural portion of each cantilever 2 that is to form the movable portion 2a, i.e., the free end, is made open from the Si lower layer 21 and the $SiO_2$ layer (that is, the piercing aperture 5 is formed). Thus, a basic structure as the cantilever 2 is completed.

Figure 5C:
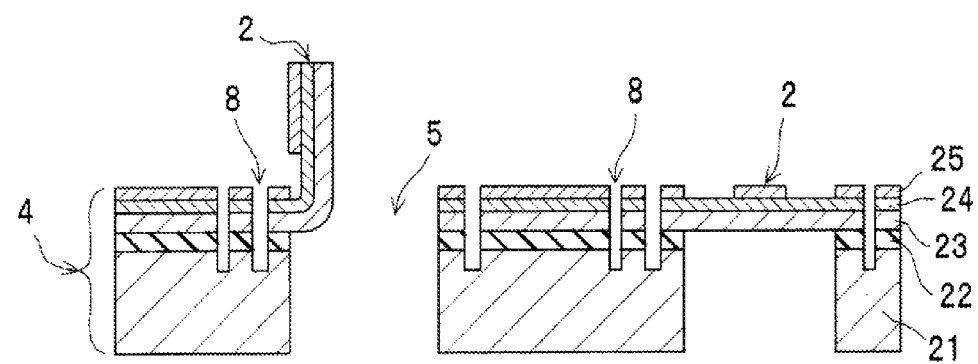
FIG. 5C is a schematic diagram of the method of manufacturing the sensor devices, showing status in which cantilevers have been formed.
Figure 6A:
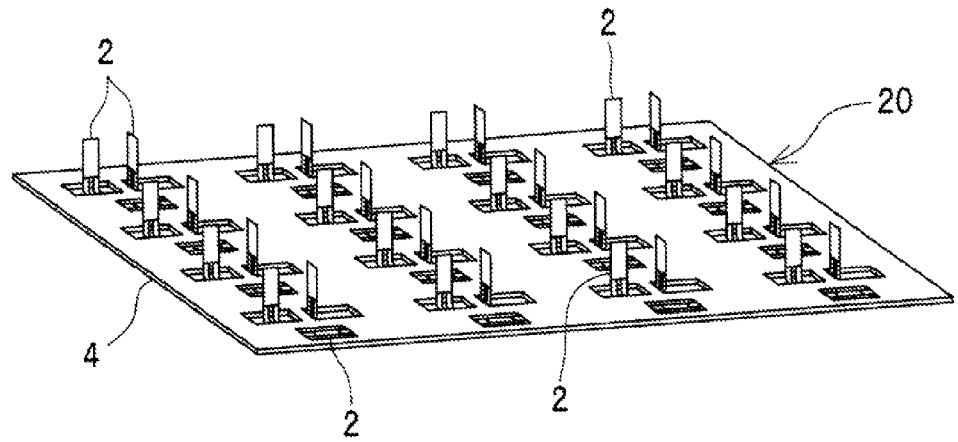
FIG. 6A is another schematic diagram showing the method of manufacturing the sensor devices, showing the status in which the cantilevers have been formed.

After that, the movable portions 2a of the X-axis direction and Y-axis direction cantilevers 2X, 2Y are raised along a vertical direction by, e.g., a magnetic field imparted to the SOI wafer 20, or the like and are subjected to specified processing, so that a state with the movable portions 2a raised (standing posture state) is retained. On the other hand, the movable portion 2a of the Z-axis direction cantilever 2Z is retained in a horizontal posture without being raised. As shown in FIGS. 5C and 6A, this results in formation of the plurality of cantilevers 2 fixed to the substrate member 4 based on the SOI wafer 20. In FIG. 5C are shown only two cantilevers, i.e., the X-axis direction cantilever 2X and the Z-axis direction cantilever 2Z, as examples of the cantilevers.

Figure 7:
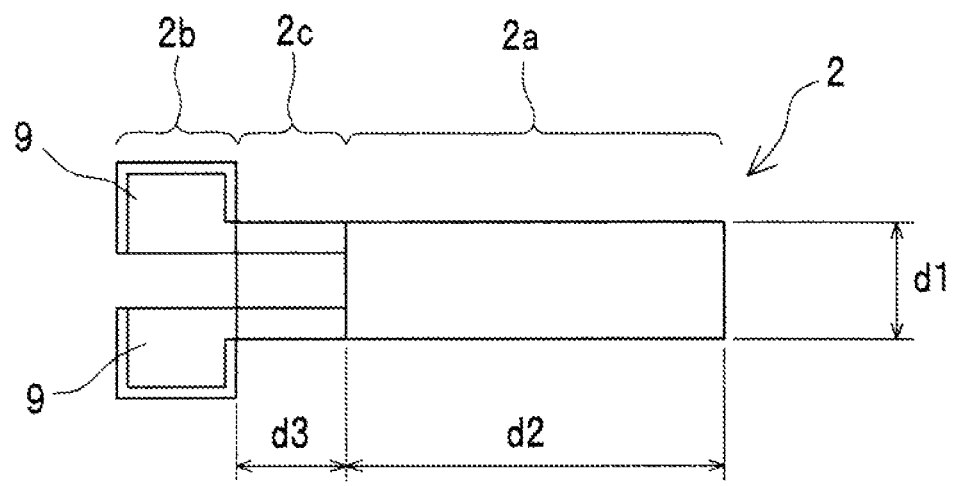
FIG. 7 is a schematic plan view of a cantilever that the sensor device includes.
Figure 8:
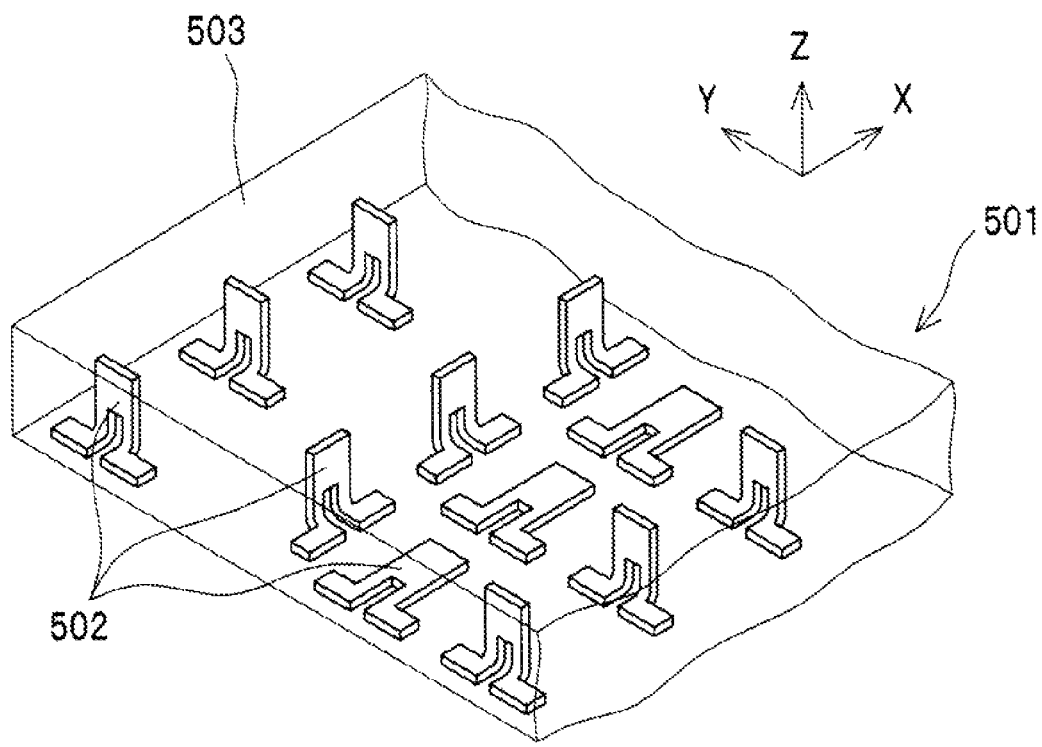
FIG. 8 is a schematic perspective view of a conventional tactile sensor.
Figure 9:
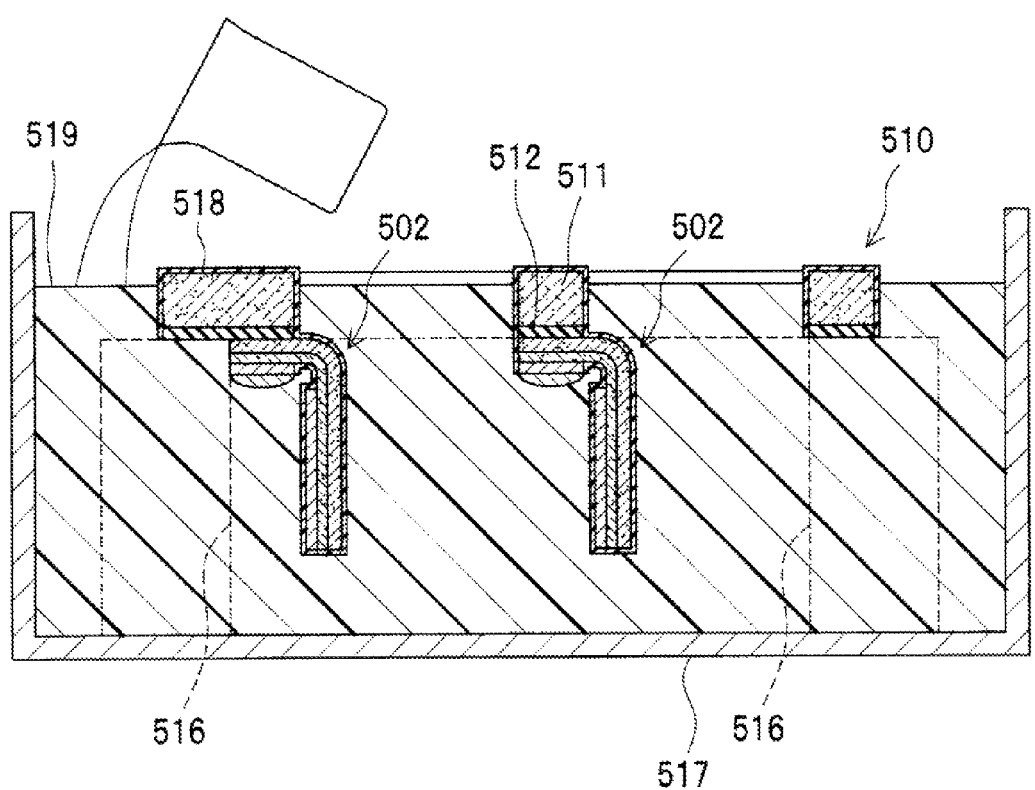
FIG. 9 is a schematic illustration of a method of manufacturing the conventional tactile sensor.
Figure 10:
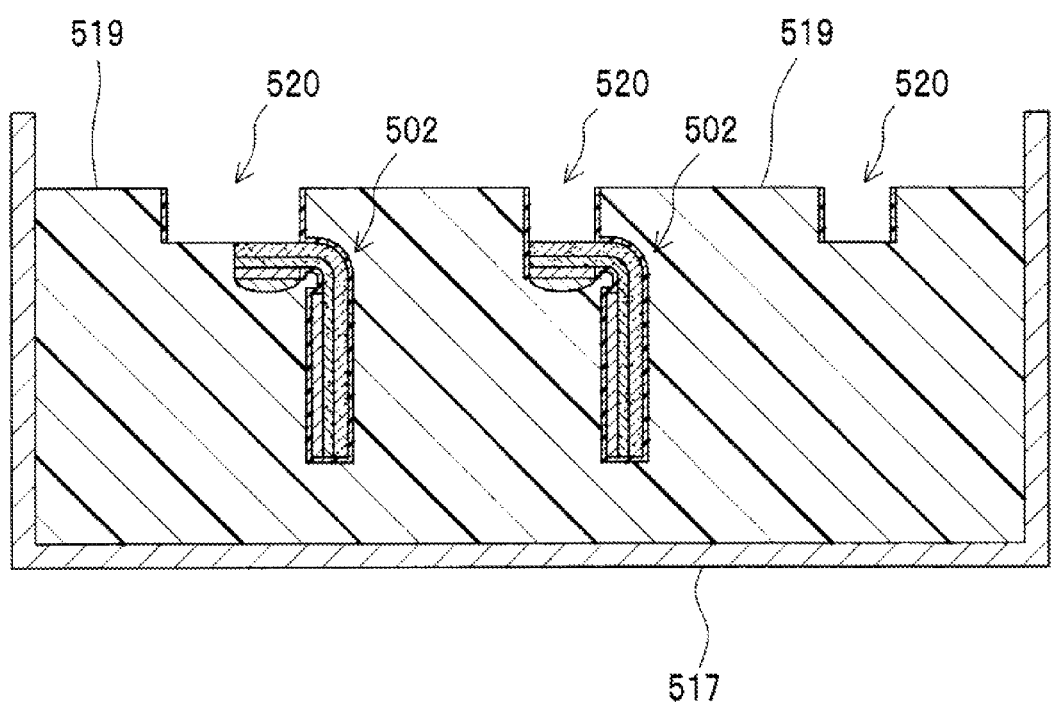
FIG. 10 is a schematic illustration of the method of manufacturing the conventional tactile sensor.
Figure 11:
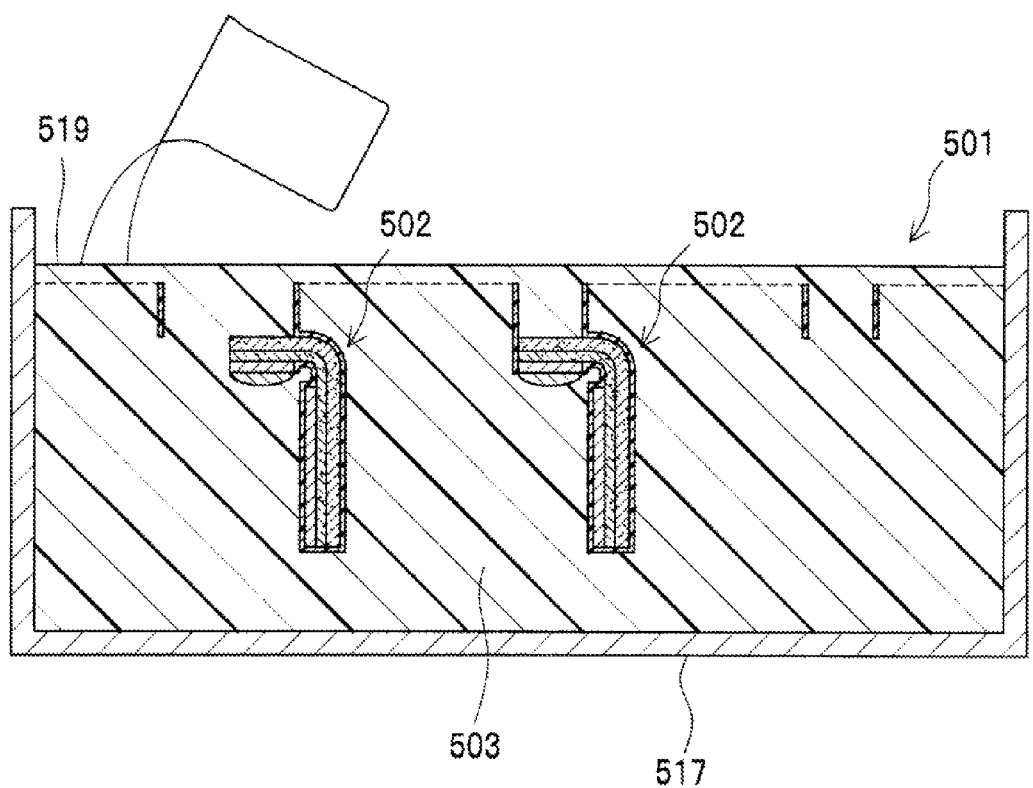
FIG. 11 is a schematic illustration of the method of manufacturing the conventional tactile sensor.

FIG. 7 shows a schematic top view of such a cantilever 2. In FIG. 7 is shown the cantilever 2 that is in a state before the provision of the raised posture. As shown in FIG. 7, the cantilever 2 is formed into such dimensions, for example, that a width d1 of the movable portion 2a thereof is 80 μm, a length d2 of the movable portion 2a being 100 μm, a length d3 of the hinge portion 2c between the movable portion 2a and the fixed portion 2b being 100 μm, and a width of the hinge portion 2c being 25 μm, where an overall length of the cantilever 2 is 300 μm. A thickness of the piezoresistive layer 24 is 100 nm. As shown in FIG. 7, terminal portions 9 for transmitting electrical signals between the portions and the external are formed in the fixed portion 2b of the cantilever 2. In the hinge portion 2c between the movable portion 2a and the fixed portion 2b is provided a hollow portion in plan view. By the hinge portion 2c that is divided into two structural bodies so that the hollow portion is provided, inclinations or other outputs given to the structural bodies can be canceled out between outputs of the piezoresistive layers, so that an amount of deformation in only one direction in the cantilever 2 can accurately be detected. The structural bodies in the hinge portion 2c are each formed with a width of 25 μm, for instance. The term "micro" in the micro three-dimensional structure element herein refers to, for example, such a size of the three-dimensional structure element that a plurality of the three-dimensional structure elements (i.e., cantilevers 2) arranged within the elastic body 3 formed with a thickness on the order of 100 μm to 1 mm hardly produce a substantial effect on the flexibility of the film-like elastic body 12, and refers to sizes of several hundred μm or less, for instance. Preferably, the cantilevers 2 are formed with a size not more than and even smaller than several hundred micrometers, according to the thickness of the elastic body 3, such that no substantial effect is given to the flexibility thereof.

Figure 5D:
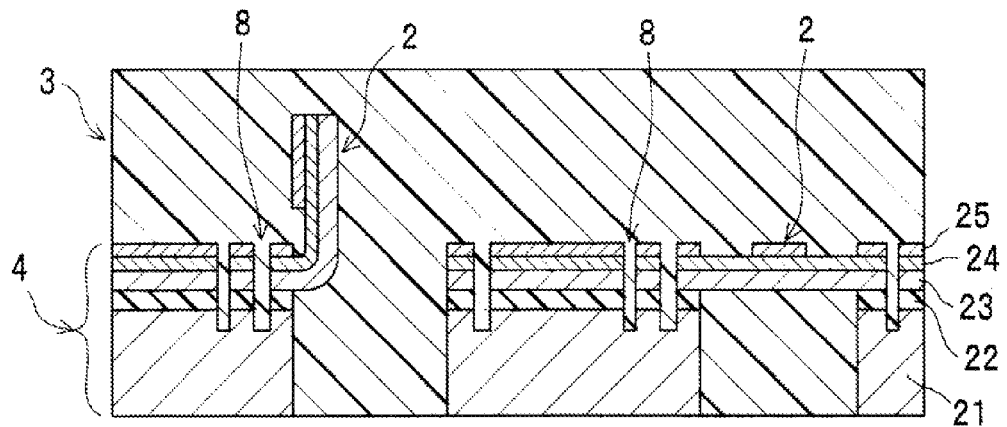
FIG. 5D is a schematic diagram of the method of manufacturing the sensor devices, showing status in which an elastic body has been placed therein.
Figure 6B:
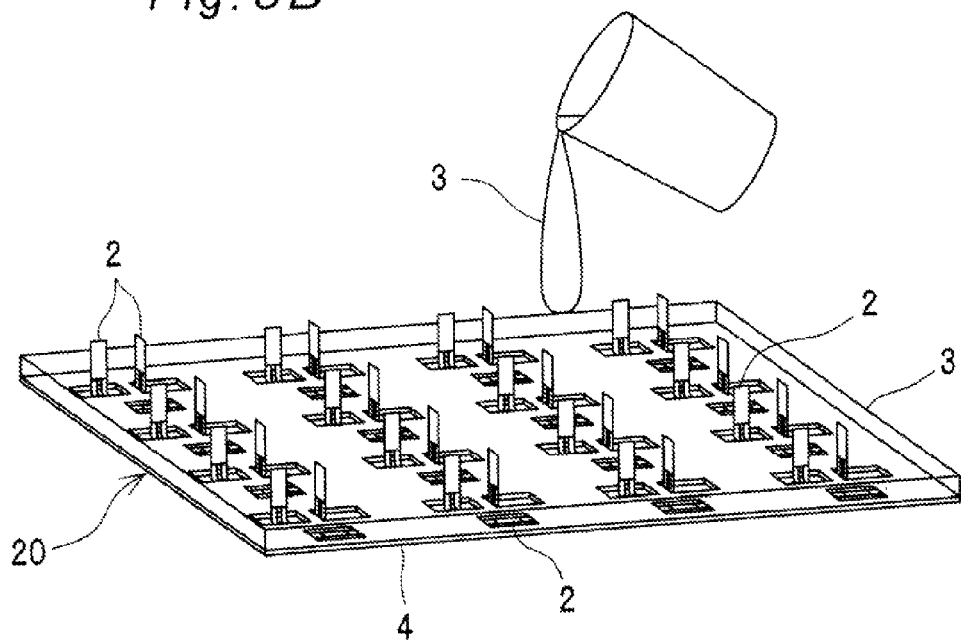
FIG. 6B is another schematic diagram showing the method of manufacturing the sensor devices, showing status in which the elastic body is being supplied.
Figure 6C:
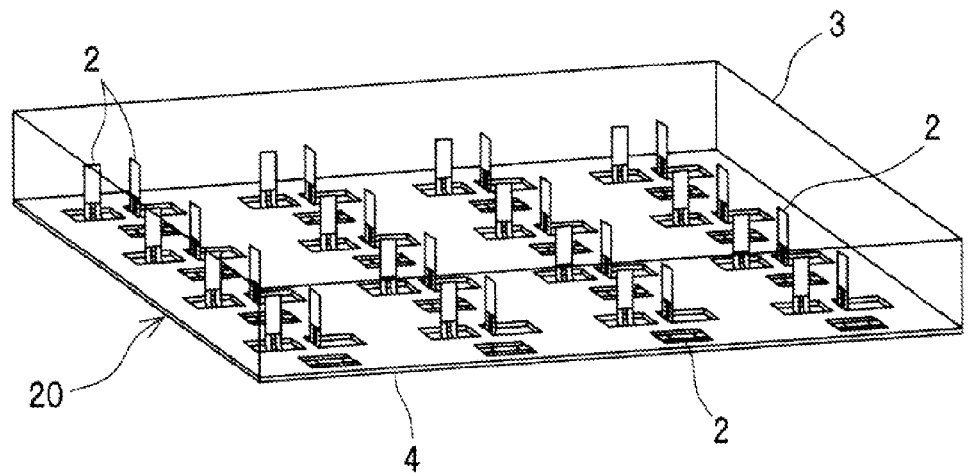
FIG. 6C is another schematic diagram showing the method of manufacturing the sensor devices, showing the status in which the elastic body has been placed therein.

As shown in FIG. 6B, the elastic body 3 is subsequently formed so as to cover the cantilevers 2 formed on the SOI wafer 20. Specifically, the elastic body (e.g., PDMS for nanostructure described above) 3 that is in fluidized state (or molten state) is injected and provided onto the surface of the SOI wafer 20 on which the cantilevers 2 are formed. The provision of the elastic body 3 is performed at least in such a manner that all the cantilevers 502 are immersed and embedded in the elastic body 3. The elastic body 3, which has high flowability, is injected into the piercing apertures 5 and the engagement holes 8 and fills the same. After that, the provided elastic body 3 in fluidized state is cured, so that the cantilevers 2 are placed within the elastic body 3 as shown in FIGS. 5D and 6C. In this state, the elastic body 3 has also come into the engagement holes 8 and has been cured, so that the elastic body 3 and the surface of the substrate member 4 are firmly fixed to each other in engagement. The elastic body 3 is formed with a thickness of, e.g., 500 μm.

Figure 5E:
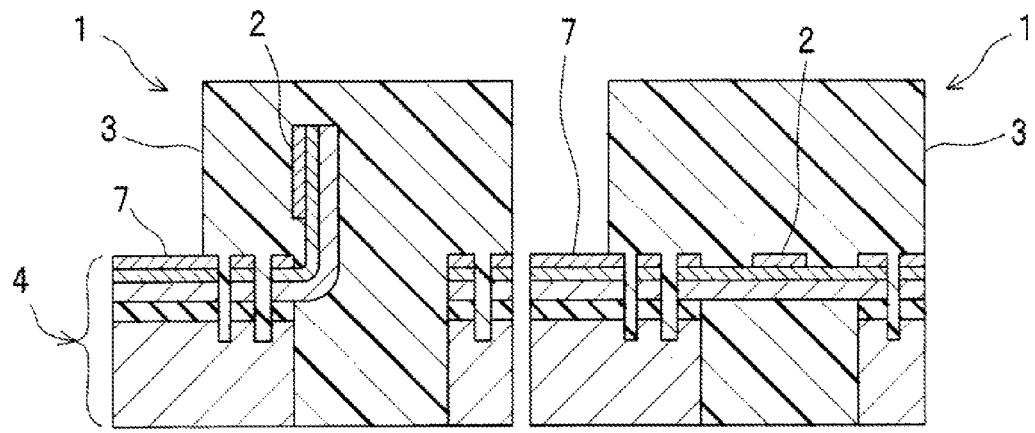
FIG. 5E is a schematic diagram of the method of manufacturing the sensor devices, showing status in which division into the sensor devices has been carried out.
Figure 6D:
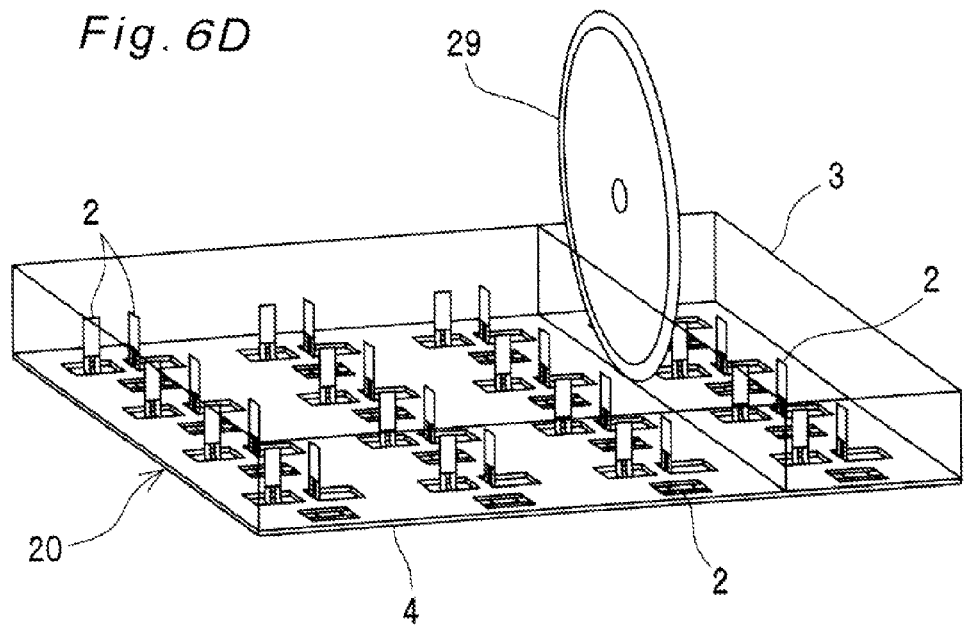
FIG. 6D is another schematic diagram showing the method of manufacturing the sensor devices, showing status in which a dicing process is being performed.

In such a state, as shown in FIG. 6C, a plurality of sensor devices 1 are in continuous state with the substrate members 4 and the elastic bodies 3 thereof connected integrally. As shown in FIG. 6D, the elastic bodies 3 and the substrate members 4 undergo cutting with use of a dicer 29 as an example of cutting jig. As a result, as shown in FIG. 5E, the sensor devices 1 are divided from one another so as to form the plurality of sensor devices 1. Before or after the division of the sensor devices 1, i.e., the dicing process, is performed a process of partially removing the elastic bodies 3 placed on the electrode terminals 7 of the sensor devices 1 and thereby exposing the electrode terminals 7. As shown in FIG. 1, for instance, the sensor devices 1 formed in this manner each include the X-axis direction cantilever 2X, the Y-axis direction cantilever 2Y, and the Z-axis direction cantilever 2Z, and are formed with dimensions on the order of 2 mm in the X-axis direction and 2 mm in the Y-axis direction, for instance.

As shown in FIG. 3, the sensor devices 1 are thereafter mounted in the specified mount positions on the flexible substrate 11. After that, the flexible substrate 11 mounted with the plurality of sensor devices 1 is immersed in fluidized PDMS and is thereby placed in the film-like elastic body 12. Once the fluidized PDMS is cured, the tactile sensor 10 shown in FIG. 3 is finished.

The sensor devices 1 are preferably placed so that the hinge portions 2c of the cantilevers 2 are positioned on a neutral line of the film-like elastic body 12, with respect to the thicknesswise direction of the tactile sensor 10. Employment of such placement prevents failure in the cantilevers that may be caused by bending of the film-like elastic body 12 because the bent film-like elastic body 12 resists elongation and contraction on the neutral line.

Instead of being formed by the provision of the fluidized PDMS, the film-like elastic body 12 may be formed by interposition of the flexible substrate 11 between two films of PDMS and integral joint of the two films, or the like.

Instead of the structure in which the sensor devices 1 and the flexible substrate 11 are both placed within the film-like elastic body 12, a structure may be employed in which only the sensor devices 1 are placed within the film-like elastic body 12 and in which the flexible substrate 11 is placed so as to be in contact with the film-like elastic body 12. Provided that such a structure is employed, a method can be employed in which the sensor devices 1 are placed within the film-like elastic body 12 by transfer of PDMS onto the surface of the flexible substrate 11 mounted with the sensor devices 1, for instance.

The cantilevers 2 that are such micro three-dimensional structure elements are structure elements each having the movable structure that is movable in at least a portion thereof and having the structure that is movable together with the elastic body placed therearound by action of an external force or the like in status of the cantilever placed in the elastic body. On condition that the three-dimensional structure configuring device (sensor device 1) formed by embedding of such micro three-dimensional structure elements within the elastic body is used without limitation to applications such as a sensor for detecting deformation of the movable portions (movable structures), e.g., on condition that the device is used for applications such as integrated circuit and photo sensor involving no deformation of the movable portions, each micro three-dimensional structure element may have no movable structure and such a three-dimensional structure configuring device can be produced with use of the manufacturing method of the invention.

The micro three-dimensional structure elements preferably have an external-force sensing function for sensing movement (deformation) of the movable structure based on elastic deformation (such as shearing strain) caused in the elastic body by action of an external force on the three-dimensional structure. The micro three-dimensional structure elements may have an external-force transmitting function for moving (deforming) the movable structure, thereby transmitting an external force to the elastic body placed therearound, and elastically deforming the elastic body. In consideration of the cantilever as an example, the external-force sensing function is represented by the function as the tactile sensor, and the external-force transmitting function is a function of partially and elastically deforming the elastic body by causing the cantilever to operate as an actuator. Thus the micro three-dimensional structure elements having the external-force sensing function and the external-force transmitting function are capable of individually and reliably fulfilling the functions in the status in which the micro three-dimensional structure elements are embedded in the elastic body. The piezoresistive layer (portion) in the cantilever forms an external-force sensing part having such a function. The cantilever can be made to function as an external-force transmitting part. The cantilever functioning as the external-force transmitting part can be achieved by separate provision of a mechanism for actuating the movable portion, e.g., a piezoelectric element, or by actuation of the movable portion by application of a magnetic field with use of magnetic anisotropy. The cantilever provided with the external-force sensing function and the external-force transmitting function in combination makes it possible to receive detection of an external force through the external-force sensing function and to transmit information through the external-force transmitting function.

The three-dimensional structure configuring device, the three-dimensional structure, and the like can be applied to integrated circuits, displays (organic EL) and the like, other than sensors and actuators as described above. The tactile sensor can be applied to probes for instrument that measures a shape of a surface of an object having a large area (having a shape of a curved surface, especially) by contact of the film-like elastic body with the surface of the object, pointing devices for input into computer, tablets, and input/output devices for achieving virtual reality, as well as cutaneous sensation sensors for robot. The three-dimensional structure can be configured as a temperature sensor, an acceleration sensor or the like in which the micro three-dimensional structure elements each having the movable structure function as structure elements for sensing temperature, acceleration or the like. Furthermore, a temperature compensation sensor can be composed by integral configuration of the sensor in which the micro three-dimensional structure elements having temperature sensing function and the micro three-dimensional structure elements having other functions are mixed and placed in the elastic body.

According to the embodiment, various effects can be obtained as follows.

First, the tactile sensor 10 can be configured, with use of the plurality of sensor devices 1 each composed, of the cantilevers 2 that are fixed onto the substrate member 4 and the elastic body 3 that is fixed to the substrate member 4 so as to cover the cantilevers 2, with the sensor devices 1 placed within the film-like elastic body 12 and spaced apart from one another. Thus the plurality of sensor devices 1 can be placed with desired intervals of arrangement and in desired positions within the film-like elastic body 12 so that the tactile sensor 10 capable of addressing various applications and specifications can be provided.

As for such cantilevers formed on an SOI wafer, in particular, a conventional technique in which the plurality of cantilevers formed on the SOI wafer are placed, just as they are, within the elastic body causes a problem in that intervals of arrangement and positions of the cantilevers are limited to positions of the formation on the SOI wafer, resulting in a low degree of freedom of the placement of the cantilevers 2. By the division of the plurality of cantilevers 2 formed on the SOI wafer 20 into one or more groups as in the embodiment, however, the cantilevers in each of the groups obtained by the division can be placed with desired intervals of arrangement and in desired positions within the film-like elastic body 12. Therefore, the tactile sensor 10 in shape of a large-area sheet can be formed, for instance. Besides, change in the intervals of arrangement of the cantilevers 2 can be addressed by simple change in the intervals of arrangement of the sensor devices 1 without change in design from a mask layout used in the etching process, and thus the degree of freedom of the placement of the cantilevers 2 therein can be increased.

In the embodiment is employed the technique in which the cantilevers 2 formed on the SOI wafer 20 are covered with the elastic body 3 and in which the SOI wafer 20 and the elastic body 3 are cut and divided into the individual sensor devices 1. The employment of such a technique ensures that the cantilevers 2 in the sensor device 1 resulting from the division are protected by the elastic body 3 and therefore improves handling ability for the sensor device 1. In particular, the cantilevers 2 themselves, which are such minute structure elements as are formed by the MEMS technology or the NEMS technology, have a characteristic in that they are comparatively susceptible to damages; however, the dicing process for the division that is performed with the cantilevers 2 protected by the elastic body 3 ensures reliable protection of the cantilevers 2 in the dividing process. After that, the cantilevers 2 in the individual sensor devices 1 continue being protected by the elastic body 3, and thus the protection for the cantilevers 2 is ensured.

In the sensor device 1, the strength of the fixation of the elastic body 3 onto the substrate member 4 can be increased by the formation of the plurality of engagement holes 8 around the positions where the cantilevers 2 are formed on the surface of the substrate member 4 and by the filling of inside of the engagement holes 8 with the elastic body 3. Such improvement in the strength of the fixation increases durability of the sensor device 1. Besides, the provision of the engagement holes 8 around the cantilevers 2 having the movable portions 2a improves integrity of the cantilevers 2 with the elastic body 3 therearound and in vicinity thereof and strengthens the correlation between the movement of the movable portions 2a and the deformation of the elastic body 3.

In the tactile sensor 10 employing the configuration that uses the two elastic bodies, i.e., the film-like elastic body 12 and the elastic body 3 of the sensor device 1, types of the elastic bodies can be made to differ according to objects and functions thereof, for instance. By use of elastic material, having higher flowability than the film-like elastic body 12, as the elastic body 3, for example, the elastic body 3 can be made to come into small parts of various components (the cantilevers 2 and the engagement holes 8) formed on the substrate member 4 and having minute shapes and can be placed so as to be in reliable contact with surfaces of the components. As the film-like elastic body 12 can be used elastic material with specifications according to an application and specifications of the tactile sensor 10. Therefore, such use of different types of elastic bodies provides the tactile sensor 10 capable of addressing various applications and specifications while ensuring the function as the sensor device 1. For the film-like elastic body 12 and the elastic body 3 may be used the same type of elastic material.

The thickness of the elastic body 3 of the sensor device 1 can be set according to the application, specifications and the like of the tactile sensor 10. With setting of a large thickness of the elastic body 3, for instance, an amount of displacement of the elastic body 3 increases on condition that a force (shearing force or pressure) of the same magnitude is exerted thereon, and thus soft contact with an object on the tactile sensor 10 can be attained. In addition, dispersion of the exerted force prevents failure in the cantilevers 2 and/or the like. The larger the thickness of the elastic body 3 is, the lower a frequency characteristic for stress detection tends to become. Therefore, the thickness of the elastic body 3 of the sensor device 1 is preferably set according to demanded specifications of the tactile sensor 10.

Besides, a quality inspection solely for the sensor devices 1 can be performed after the processes for manufacturing the sensor devices 1 are carried out and before the tactile sensor 10 is manufactured. Such a quality inspection makes it possible to manufacture the tactile sensor 10 with elimination of faulty sensor devices 1 and to improve quality of the manufactured tactile sensor 10.

Though the configuration in which the X-axis direction cantilever 2X, the Y-axis direction cantilever 2Y, and the Z-axis direction cantilever 2Z, i.e., the cantilevers capable of detecting stresses in the different three directions are placed in the sensor device 1 has been described as an example in the above description, the embodiment is not limited to such a configuration. Alternatively, for instance, only one cantilever 2 may be provided in the sensor device 1 or a plurality of cantilevers 2 capable of detecting stresses in the same direction may be provided therein.

With the employment of the configuration in which the cantilevers 2 capable of detecting stresses in such different three directions as the X-axis, the Y-axis, and the Z-axis are provided in the sensor device 1, however, stresses in the different three directions can be detected by the one sensor device 1, that is, in the same position. Circuits common to such three cantilevers 2, e.g., control circuits for temperature compensation, amplification and/or the like can be provided in common in a circuit unit that the sensor device 1 includes, so that the specifications can be made adjustable for each sensor device 1 and so that reliability of the sensor devices 1 can be increased. Such commonization of the circuit unit allows commonization of electrical conditions of the sensor device 1 and size reduction for the circuit structure.

Though the engagement holes 8 that are formed as holes not piercing the substrate member 4 have been described in the above description, the engagement holes 8 may be formed as through holes. The engagement holes 8 formed as through holes increase ability for filling of the engagement holes 8 with the elastic body 3. For the engagement holes formed as holes not piercing through the substrate member 4, the ability for filling can be increased by use of elastic material having high flowability and vacuum degassing of bubbles remaining in the holes.

Such engagement holes 8 are preferably formed so as to increase a surface area of the substrate member 4 in contact with the elastic body 3, and thus a large number of engagement holes 8 having small diameters are preferably formed with greater depths. In view of the increase in the contact surface area, inner surfaces of the holes 8 are preferably formed of surfaces having a large number of depressions and protrusions. The diameters, depths, shapes of the inner surfaces and the like of the holes, however, are preferably determined in view of performance of reliable filling in consideration of specifications such as flowability of the elastic body 3. The number, specifications and the like of the engagement holes 8 are preferably determined so as not to impair strength of the substrate member 4.

The engagement holes 8 have been described as an example of the engagement portions in the above description, and the holes 8 may employ various shapes such as circular, elliptic, rectangular, and polygonal shapes. As the engagement portions, structure parts in shape of depressions or protrusions may be formed on the surface of the substrate member 4.

Though the dicing process that uses the dicer 29 as means for cutting and division into the sensor devices 1 has been described as an example in the above description, a dividing process using an etching process or the like may be performed instead of the use of such a cutting jig.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of specifications, drawings, and claims of Japan Patent Application No. 2008-64359 filed on Mar. 13, 2008 is incorporated herein by reference in its entirety.

The invention claimed is:

1. A three-dimensional structure comprising:
   a plurality of three-dimensional structure configuring devices, each three-dimensional structure configuring device including
      a substrate member in which a plurality of piercing apertures are formed,
      micro three-dimensional structure elements each having a movable structure including a fixed portion which is fixed to an edge of a corresponding one of the piercing apertures, and
      an elastic body which covers the micro three-dimensional structure elements and the piercing apertures, wherein a plurality of engagement holes are formed along edges of each of the piercing apertures in a vicinity of positions around each of the piercing apertures, and the plurality of engagement holes are filled with the elastic body, and the elastic body is fixed to the substrate member; and
   a film-like elastic body within which the plurality of three-dimensional structure configuring devices are placed so that the substrate members are spaced apart from each other.

2. The three-dimensional structure as defined in claim 1, wherein resin forming the elastic bodies has higher flowability in a molten state than resin forming the film-like elastic body.

3. The three-dimensional structure as defined in claim 1, further comprising a flexible substrate on which the plurality of three-dimensional structure configuring devices are mounted, wherein
   the flexible substrate is placed within the film-like elastic body.

4. A manufacturing method for three-dimensional structure configuring devices, the method comprising:
   forming a plurality of engagement holes in a vicinity of positions around fixed positions at which fixed portions of a plurality of micro three-dimensional structure elements each having a movable structure are respectively fixed to a substrate member, such that the engagement holes are arranged along an outer circumference of each of the fixed positions;
   forming a plurality of piercing apertures in the substrate member so as to place the fixed portions at respective edges of the piercing apertures;
   thereafter supplying resin material in a fluidized state onto the substrate member so that the micro three-dimensional structure elements and piercing apertures are covered with the resin material and so that the plurality of engagement holes are filled with the resin material;
   thereafter curing the resin material to form an elastic body formed of the resin material and to fix the elastic body to the substrate member; and
   thereafter cutting the substrate member and the elastic body so as to divide the plurality of micro three-dimensional structure elements into groups, and thereby forming the plurality of three-dimensional structure configuring devices in each of which one or more micro three-dimensional structure elements are fixed to one of the divided substrate members and are placed within one of the divided elastic bodies.

5. A manufacturing method for a three-dimensional structure, the method comprising:
   forming the three-dimensional structure by placing the plurality of three-dimensional structure configuring devices, manufactured by the manufacturing method of claim 4, within a film-like elastic body so that the substrate members thereof are spaced apart from each another.

6. The manufacturing method for a three-dimensional structure of claim 5, wherein resin forming the elastic bodies has higher flowability in a molten state than resin forming the film-like elastic body.

7. The manufacturing method for a three-dimensional structure of claim 4, wherein said cutting of the substrate member and the elastic body so as to divide the plurality of micro three-dimensional structure elements into groups is performed without cutting through the engagement holes.

* * * * *